United States Patent
Smith

(10) Patent No.: US 9,917,706 B1
(45) Date of Patent: Mar. 13, 2018

(54) RECOVERING INDEPENDENT WAVEFORMS FROM INPUT BITSTREAM DATA

(71) Applicant: Hewlett-Packard Development Company, L.P., Houston, TX (US)

(72) Inventor: David E Smith, Vancouver, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/558,327

(22) PCT Filed: May 27, 2015

(86) PCT No.: PCT/US2015/032629
§ 371 (c)(1),
(2) Date: Sep. 14, 2017

(87) PCT Pub. No.: WO2016/190860
PCT Pub. Date: Dec. 1, 2016

(51) Int. Cl.
| | | |
|---|---|---|
| *H03M 3/00* | (2006.01) | |
| *H04L 25/02* | (2006.01) | |
| *G01R 21/133* | (2006.01) | |
| *H04L 25/03* | (2006.01) | |
| *H04H 40/45* | (2008.01) | |
| *H04L 27/233* | (2006.01) | |
| *H04L 27/10* | (2006.01) | |
| *H04L 27/14* | (2006.01) | |

(52) U.S. Cl.
CPC ............ *H04L 25/02* (2013.01); *G01R 21/133* (2013.01); *H04H 40/45* (2013.01); *H04L 25/03012* (2013.01); *H04L 27/10* (2013.01); *H04L 27/14* (2013.01); *H04L 27/2338* (2013.01)

(58) Field of Classification Search
CPC ... H04L 25/02; H04L 25/03012; H04H 40/45; G01R 21/133
USPC .................................................. 341/143–144
See application file for complete search history.

(56) References Cited

U.S. PATENT DOCUMENTS

| | | | |
|---|---|---|---|
| 4,096,436 A | | 6/1978 | Cook et al. |
| 5,809,459 A | * | 9/1998 | Bergstrom ............ G10L 19/125 704/218 |
| 6,018,368 A | * | 1/2000 | Kim ..................... H04N 19/176 348/699 |
| 6,072,834 A | * | 6/2000 | Kim ..................... H04N 19/176 348/384.1 |

(Continued)

OTHER PUBLICATIONS

Bashi, S.M., "Simulation and Development of Low Harmonics High Voltage Chain Power Inverter," European Journal of Scientific Research vol. 25 No. 1 ~ Jan. 5, 2009, 7 pgs.

*Primary Examiner* — Lam T Mai
(74) *Attorney, Agent, or Firm* — HP Inc. Patent Department

(57) ABSTRACT

An example device in accordance with an aspect of the present disclosure includes a non-linear compensator, an interpolator, a demultiplexer, and a demodulator. The non-linear compensator is to correct a non-linearity of the input bitstream data to obtain linearized bitstream data. The interpolator is to convert a non-constant sample rate of the linearized bitstream data to obtain constant sample rate bitstream data. The demultiplexer is to demultiplex the constant sample rate bitstream data into a first waveform and a second waveform. The demodulator is to demodulate the first waveform and the second waveform.

15 Claims, 8 Drawing Sheets

(56) References Cited

U.S. PATENT DOCUMENTS

| | | |
|---|---|---|
| 7,715,176 B2 | 5/2010 | Perez et al. |
| 7,859,442 B2 | 12/2010 | Daniels et al. |
| 7,911,286 B2 | 3/2011 | Smith |
| 8,076,988 B2 | 12/2011 | Smith |
| 8,411,790 B2 | 4/2013 | Fornage |
| 2002/0071301 A1 | 6/2002 | Kinghorn |
| 2002/0101939 A1 | 8/2002 | Sundaresan |
| 2004/0056785 A1 | 3/2004 | Webster et al. |
| 2005/0225469 A1 | 10/2005 | White |
| 2008/0232452 A1 | 9/2008 | Sullivan et al. |
| 2009/0129257 A1 | 5/2009 | Maltsev et al. |
| 2012/0127009 A1 | 5/2012 | Pagnanelli |
| 2014/0169501 A1* | 6/2014 | Nazarathy .......... H03H 17/0266 375/316 |
| 2015/0032788 A1* | 1/2015 | Velazquez ............. H04L 27/265 708/819 |
| 2016/0191020 A1* | 6/2016 | Velazquez .......... H03H 21/0067 341/118 |

* cited by examiner

US 9,917,706 B1

RECOVERING INDEPENDENT WAVEFORMS FROM INPUT BITSTREAM DATA

BACKGROUND

High speed ink jet printers can improve print quality and product throughput by using dryers with heater elements. However, if the power provided to the printers (e.g., as alternating current (AC) mains voltage) is unreliable and/or sags, heater current interaction with circuit resistance can risk brown-out of the direct current (DC) power supply of such printers.

BRIEF DESCRIPTION OF THE DRAWINGS/FIGURES

DETAILED DESCRIPTION

Examples described herein enable AC power monitoring to be used in products to address unexpected brown-outs, e.g., caused by variations in the AC mains voltage. A single frequency modulated (FM) bitstream, obtained from a power monitor of the device, can be analyzed to quickly and efficiently identify AC mains voltage and product current waveforms. Digital signal processing can be used for accurate recovery of the voltage and current waveforms from the input bitstream data obtained from power monitors. In an example, the power monitor to produce the input bitstream data may be based on scaled waveforms having, different DC offsets (voltage offset and current offset) that represent AC mains voltage and current. In alternate examples, additional waveforms may be used, e.g., for additional aspects of the AC mains voltage and/or other information to be included in the input bitstream data to be provided. These waveforms are alternately sampled and converted, by a modulator based on a 555 timer, into a voltage on a timing capacitor of the modulator that alternates between different distinct carrier frequencies and is converted into a single digital waveform. A digital divide-by-two hardware converts this asymmetrical digital waveform into a symmetrical digital signal. Finally, galvanic isolation is used to convert this signal into the input bitstream data, which can be analyzed and used as input by the examples described below.

To address such issues associated with receiving input bitstream data containing multiple different forms of information to be analyzed, examples described herein may correct a non-linearity of the input bitstream data to obtain linearized bitstream data, convert a non-constant sample rate of the linearized bitstream data to obtain constant sample rate bitstream data, demultiplex the constant sample rate bitstream data into a first waveform and a second waveform, and demodulate the first waveform and the second waveform. In this manner, examples described herein may quickly and efficiently analyze data contained in the received input bitstream data, to enable printing devices to analyze and respond to changes in the input bitstream data without introducing excessive latency. For example, printing devices may react to changes in AC mains power to avoid damaging the printing device.

Figure 1:
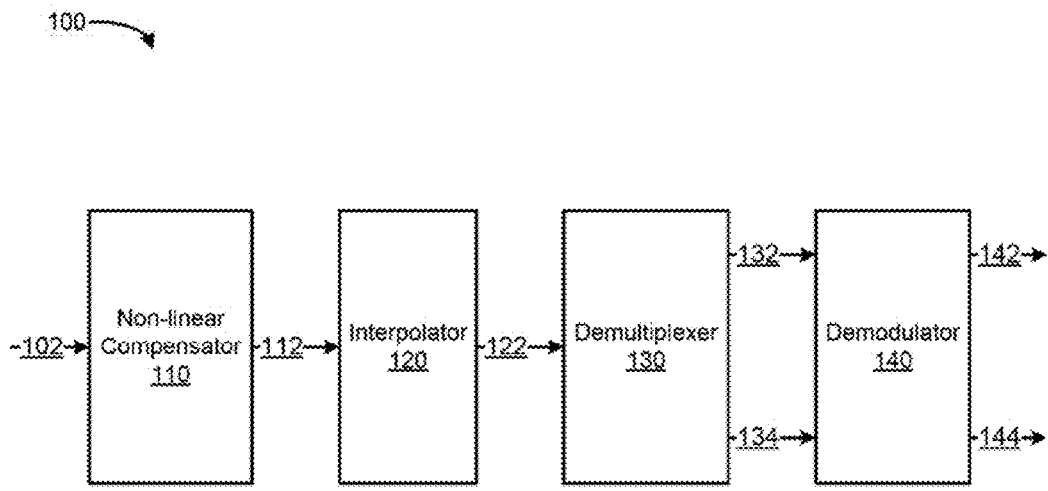
FIG. 1 is a block diagram of a device including an interpolator according to an example.

FIG. 1 is a block diagram of a device 100 including an interpolator 120 according to an example. The device 100 also includes a non-linear compensator 110, a demultiplexer 130, and a demodulator 140. The device 100 is to receive input bitstream data 102 (which can be received from a current/voltage monitor or other monitoring device whose data is to be analyzed) at the non-linear compensator 110, which provides linearized bitstream data 112 to the interpolator 120, which provides constant sample rate bitstream data 122 to the demultiplexer 130, which provides first waveform 132 and second waveform 134 to the demodulator 140, which provides demodulated first waveform 142 and demodulated second waveform 144.

The device 100 may be implemented as circuitry, e.g., in a controller of a printing device, to correct bitstream converter non-linearity, convert non-constant sample rate FM data into constant sample rate waveforms, identify and split single bitstream data into voltage and current waveforms, and demodulate FM data, among other benefits for low-latency and efficient analysis of the input bitstream data 102. The device 100 also may be implemented in other forms, such as machine-readable instructions (e.g., firmware) executable by processor(s) to perform digital signal processing (DSP) to convert input bitstream data received as FM output of power monitoring hardware of a printer.

By compensating for hardware non-linearity, device 100 can produce extremely linear results. The example interpolator 120 can minimize information latency, by computing coefficients of third-order equations, and performing cubic spline interpolation using the coefficients quickly and efficiently, to create constant sample rate frequency values in time intervals between pairs of sampled frequency-time values. Device 100 may employ techniques having low complexity for fast and reliable operations. The output of device 100, the demodulated first waveform 142 and demodulated second waveform 144, may be further analyzed independently, to assess a status of AC mains power and otherwise direct the printer to respond to conditions of the AC mains power. Thus, the example device 100 can enable printing devices, or other devices, to quickly and efficiently retrieve information from input bitstream data 102, and react to changes in that data without introducing excessive latency.

Figure 2:
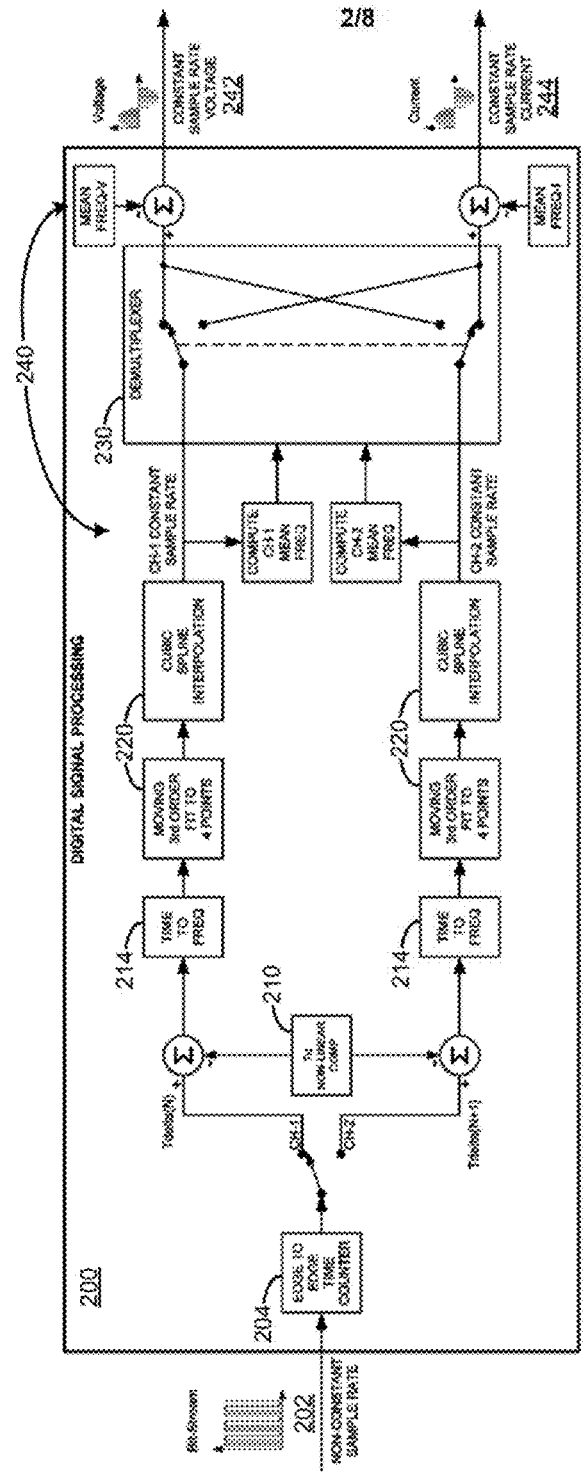
FIG. 2 is a block diagram of a device including an interpolator according to an example.

FIG. 2 is a block diagram of a device 200 including an interpolator 220 according to an example. The device 200 is to receive, at a counter 204, input bitstream data 202 from, e.g., a current/voltage monitor that is to provide the input bitstream data 202 based on monitoring AC mains power for powering a printing device. Output of the counter 204 is to be modified by a non-linear compensator 210 and passed to a frequency converter 214. Output of the frequency converter 214 is passed to the interpolator 220, and then passed on to a demultiplexer 230 and a demodulator 240, which outputs the demodulated first waveform 242, and the demodulated second waveform 244.

By way of introduction, the processing of the input bitstream data 202 to produce demodulated first and second waveforms 242, 244 can involve various components. In general, the counter 204 may be a digital counter, to identify a time interval between edges of the input bitstream data 202. For example, the counter 204 may identify the time interval from a positive edge to a positive edge, or a negative edge to a negative edge. Based on the identified intervals, the counter 204 can instruct, e.g., a splitter (shown symbolically as an arrow leading from the counter 204 to the two points associated with CH-1 and CH-2) to split the input bitstream data 202 into alternate samples, CH-1 and CH-2. Next, the non-linear compensator 210 is to subtract a non-linear compensation value from the time intervals of CH-1 and CH-2, to correct for non-linearity in the hardware used to generate the input bitstream data 202. For example, the non-linearity may correspond to a discharge time Td of a timing capacitor of a 555 timer in a modulator (not shown) which was used to initially generate the input bitstream data 202 that is received as input to the device 200. The data is then processed by the frequency converter 214, to convert compensated time interval values to frequency samples. For example the frequency converter 214 can take the mathematical reciprocal of the compensated value processed by the non-linear compensator 210. The device 200 also can use the time interval value obtained by the frequency converter 214 to compute the effective time for each frequency sample. Due to frequency modulation, the interval between each frequency sample obtained from the input bitstream data 202 is not constant.

The data then proceeds to the interpolator 220, which is to apply a moving $3^{rd}$-order fit to four data points, and perform cubic spline interpolation. For example, four frequency samples and their corresponding time values can be used to compute the coefficients of a third-order equation. Then the coefficients can be used in cubic spline interpolation to create constant sample rate frequency values in the time interval between the second and third of the four frequency samples. Next, the demodulator 240 is to compute the mean frequency values for CH-1 and CH-2. The device 200 can use the mean frequency values computed by the demodulator 240 to identify which of CH-1 and CH-2 corresponds to voltage data or current data. This information can be used by the demultiplexer 230 to appropriately direct the data from CH-1 and CH-2 to voltage and current outputs. Additionally, the mean frequency identified by the demodulator 240 also can be subtracted by the demodulator 240 from each of the frequency values output by the demultiplexer 230, thereby demodulating the signals to produce the demodulated first and second waveforms 242, 244.

By way of further explanation, the input bitstream data 202 received by the device 200 may be an interleaved bit-stream that includes multiple FM signals (two signals are illustrated, and in alternate examples, additional signals may be included with a corresponding number of additional channels). The edge-to-edge timer counter 204 can identify positive-to-positive or negative-to-negative edges of the input bitstream data 202. Accordingly, alternate edge-to-edge portions are sent to their corresponding CH-1 or CH-2 branches, e.g., by use of a splitter. For example, a first edge-to-edge time may be related to CH-1, and the next edge-to-edge time to CH-2, with the data alternating back and forth between the channels accordingly. The data at these early stages in device 200 is referred to as CH-1 and CH-2 because, at this point in the processing, the device 200 has not yet identified which channel corresponds to voltage or current (this occurs later by the demodulator 240 computing the mean frequencies). The CH-1 and CH-2 data is labeled Tdelta(N) and Tdelta(N+1), respectively, indicating that the data is in the form of timing count numbers in the digital domain, representing the edge-to-edge time expressed in a number of clock pulses edge-to-edge for samples of the CH-1 and CH-2 data. For example. Tdelta(N) may achieve a given edge-to-edge count of 20,000, and Tdelta(N+1) may achieve a given edge-to-edge count of 30,000, or the corresponding count values that the channels happen to contain according to the frequency modulation for a given input bitstream data 202.

The non-linear compensator 210 then subtracts, from the CH-1 data and the CH-2 data, an offset (Td), which represents the discharge time described above, to achieve non-linear compensation for the CH-1 and CH-2 data. Subtraction is illustrated in FIG. 2 by a summation element, having a negative sign assigned to the input to be subtracted. Subtraction may be performed using hardware (e.g., using a counter), and/or using firmware/software (e.g., using a controller to perform subtraction).

Proceeding to the interpolator 220, a first block (labeled moving 3rd order fit to 4 points) is to receive data samples that may be unevenly spaced, i.e., occurring at different time intervals according to a non-constant sampling rate per FM modulation. Four data points are accumulated, and the moving $3^{rd}$ order fit block solves a third-order equation for those data points, to fit the third-order equation to those four data points. Then, the second block (labeled cubic spline interpolation) can use the third-order equation to interpolate between the middle two of the four accumulated data points, to interpolate to a new constant sample rate. Other forms of interpolation may be used (e.g., zero padding interpolation), including variants of cubic spline interpolation, to achieve a good curve fit to the middle two samples (e.g., by using the additional/trending sample information provided by the previous (first) sample and the following (fourth) sample relative to the second and third samples). Thus, using four data samples to fit one interval of the three intervals (among the four data points), provides high linearity and low distortion according to a conservative cubic spline interpolation. Examples therefore avoid skewing the sample positions or causing timing jitter, which could cause an increase in noise that would be visible in a fast Fourier transform (FFT) of the interpolated waveforms. Furthermore, the present examples avoid a need for extensive (e.g., second-order lowpass) filtering, thereby avoiding the introduction of additional latency and ripple. Latency is particularly disadvantageous for applications where quick decisions are needed, e.g., for a printing device to assess a collapsing AC mains voltage and prevent damage to the printing device. The example interpolation approach described above, according to cubic spline interpolation, can be differentiated from conventional interpolation according to a lack of elevated harmonic distortion and noise floors in its FFT, in contrast to conventional interpolation approaches. An additional benefit provided by example device 200 is avoiding a need to keep a dedicated timebase for the non-constant sample rate data. As newer data samples are accumulated, older data samples can be discarded, and the approach can be repeated ad infinitum to piece together the waveform based on the interpolated data. The interpolator 220 provides output in the form of a constant sample rate for CH-1 and CH-2.

The demodulator 240 includes first blocks, to compute mean frequencies for the channels, and second blocks, to subtract the corresponding computed mean frequencies from output of the demultiplexer 230. Thus, the demodulator 240 is to compute the mean frequencies of CH-1 and CH-2, which can be used to identify voltage offsets of CH-1 and CH-2. The data initially received as input source data 202 includes alternating streams of data that are at different average frequencies. Accordingly, the demodulator 240 can identify whether a given channel (i.e., CH-1 or CH-2) corresponds to, e.g., voltage information or current information (based on what type of information is stored interleaved in the input source data 202). The demodulator 240 can compute mean frequencies based on using an interval of data from a channel. For example, the demodulator 240 can sample eight seconds worth of data, take the running average of that eight seconds of data, and assign the average as the mean frequency for that channel. CH-1 and CH-2 may have different mean frequencies.

The demultiplexer 230 may use the identification information (whether a given channel's mean frequency corresponds to voltage or current) from the demodulator 240, to switch appropriately to assign voltage data and current data to their corresponding demultiplexer outputs. In an example, the demultiplexer 230 may be a hardware relay, or may be performed in software/firmware by a controller. Output from the demultiplexer 230 is demodulated by the demodulator 240, by, subtracting, off the mean frequency, as computed earlier, corresponding to its channel output from the demultiplexer 230. Thus, the mean frequencies enable the device 200 to identify which channel corresponds to voltage or current, and also enables the device 200 to demodulate the output data by subtracting off the carrier frequencies.

Figure 3:
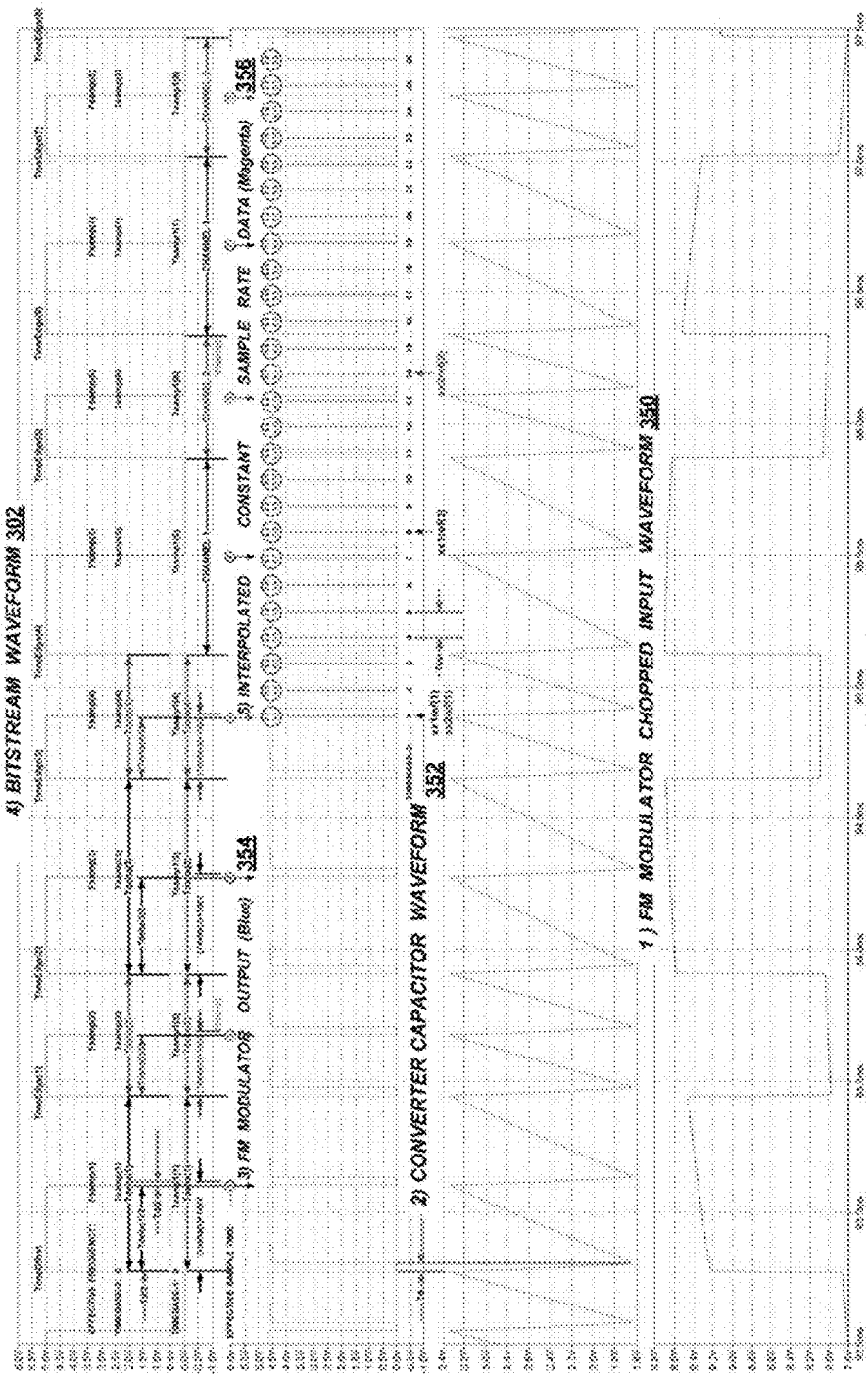
FIG. 3 is a diagram of waveforms including interpolated constant sample rate data according to an example.

FIG. 3 is a diagram of waveforms including interpolated constant sample rate data 356 according to an example. The waveforms also include FM modulator chopped input waveform 350, converter capacitor waveform 352, FM modulator output 354, bitstream waveform 302 (which also serves as the input bitstream data referred to above), and interpolated constant sample rate (CSR) data 356.

The FM modulator chopped input waveform 350 is an example of an interleaved signal received at a modulator (not shown) and used by the modulator to produce the input bitstream data, which is to be interpolated by the example devices described herein. The FM modulator chopped input waveform 350 includes interleaved outputs of a voltage monitor and current monitor, illustrating how the two different signals have different DC offsets relative to each other (which may be used to identify which data corresponds to voltage or current, e.g., by the demodulator 240 of FIG. 2). The FM modulator chopped input waveform 350 is used to generate the converter capacitor waveform 352.

The converter capacitor waveform 352 is the signal generated by an internal timing capacitor (not shown) of the modulator. The illustrated capacitor voltage transitions between two fixed voltages (1.67 V and 3.33 V as shown). The positive going voltage time interval is directly proportional to the input voltage from either the voltage monitor or current monitor, referred to above with respect to the FM modulator chopped input waveform 350. However, the capacitor's negative going voltage time interval (discharge time Td) is a constant independent of either voltage or current. Thus, Td introduces a non-linearity into the conversion process. The capacitor can be associated with a 555 timer, that is set and reset according to the FM modulator chopped input waveform 350 in generating the bitstream waveform 302 (i.e., the input bitstream data to be demultiplexed). The converter capacitor waveform 352 is used by the modulator to, generate the FM modulator output 354.

The FM modulator output 354 corresponds to output of the FM modulator used to generate the input bitstream data During each voltage or current interval, the modulator produces two complete cycles. Because of the short logic low time interval (Td), this waveform is not suitable to directly drive a relatively slow opto-coupler used for galvanic isolation. Accordingly, to generate the drive for the opto-coupler, the FM modulator output 354 signal is processed by a divide-by-two block (not shown) to produce a symmetrical bitstream drive waveform, resulting in the bitstream waveform 302 which can serve as input bitstream data.

The bitstream waveform 302 is a bitstream waveform produced by a modulator and passed through galvanic isolation. Each of the time intervals between adjacent positive edges of the waveform consists of discrete interval measurements (Tdelta(1), Tdelta(2), etc.). The first detected positive edge is considered zero time for the non-constant sample timebase (TIMEBASE-1). The effective time at which each sample occurs is computed from the discrete interval measurements relative to this zero time. Sample Tsamp1(1) occurs at (Tdelta(1)+Td)/2, Sample Tsamp1(2) occurs at Tdelta(1) (Tdelta(2)+Td)/2. Sample Tsamp1(N) occurs at sum[Tdelta(1 to N−1)]+(Tdelta(N)+Td)/2.

An offset timebase (TIMEBASE-2) can be used when performing computations. TIMEBASE-2 is referenced to the same TimeOffset as TIMEBASE-1, However, the effective sample time is offset in time between the two timebases by a factor of Td/2. Sample Tsamp(1) occurs at Tdelta(1)/2. Sample Tsamp(2) occurs at Tdelta(1)+Tdelta(2)/2. Sample Tsamp(N) occurs at sum[Tdelta(1 to N−1)]+Tdelta(N)/2. The samples alternate between odd samples (CH-1) and even samples (CH-2).

By way of further explanation, the samples in the bitstream waveform 302 are measured edge-to-edge, thereby automatically creating a timebase as well. Eight samples are illustrated, and interpolation can be performed upon accumulating four samples (in view of using interpolation based on four data points). As set forth above, cubic spline interpolation can be used to convert the non-constant sample rate data into constant sample rate waveforms. Because this approach operates using four non-constant rate samples for each channel, it can begin upon accumulating at least four samples. For CH-1, this corresponds to samples 1, 3, 5 and 7, and for CH-2 this corresponds to samples 2, 4, 6 and 8. Furthermore, interpolated samples are to occur at the same time in the interpolated timebase for CH-1 and CH-2. Because interpolation occurs between the middle two samples of a four-sample set (e.g., 3 and 5, or 4 and 6), this means that the common interpolated timebase can begin at sample 4.

Referring back to FIG. 3, interpolated constant sample rate data 356 illustrates the interpolated constant sample rate samples, shown as pulses superimposed over the FM modulator output 354. The train of pulses of the interpolated constant sample rate data 356 begins coincident with non-constant rate sample 4 of the bitstream waveform 302, and proceeds with a constant sample rate time interval of Tcsr between pulses. Each pulse is associated with a source of non-constant rate samples, to create the interpolated sample. For example, the first CH-1 interpolated pulse starts with sample 3 and is designated 3.1, for interpolated sample 1. Likewise, the first CH-2 interpolated point starts with sample 4, and is designated 4.1 for interpolated sample 1.

The first number is the beginning sample used to generate the interpolated point, and the second number is the interpolation.

A timebase (TIMEBASE-3) is also shown below the pulses in the interpolated constant sample rate data 356, which counts the constant sample rate samples. TIMEBASE-3 illustrates a constant time interval between samples which can be used to identify timing easily, so that there is no need to maintain a continuous timebase (e.g., if the timebase were not constant rate). To eliminate the need for two continuous constant sample rate timebases, reference points are defined for each channel. The reference point xx1ref is defined for CH-1, and the reference point xx2ref is defined for CH-2. These time references are initially defined at the fourth non-constant sample (at the point in Fsamp(4) indicated as Tdelta(4)/2 in the bitstream waveform 302). The references for the next sets are the first sample time at the start of the second set of interpolated samples in each channel. For CH-1, this corresponds to interpolated sample 5.1, and for CH-2, this corresponds to sample 6.1. For the CH-1 sample set using non-constant samples 3, 5, 7 and 9, the time at interpolated sample 5.1 is subtracted from the effective time values for all four samples. This eliminates the need to maintain a continuous timebase.

Referring to FIGS. 4-7, flow diagrams are illustrated in accordance with various examples of the present disclosure. The flow diagrams represent processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

Figure 4:
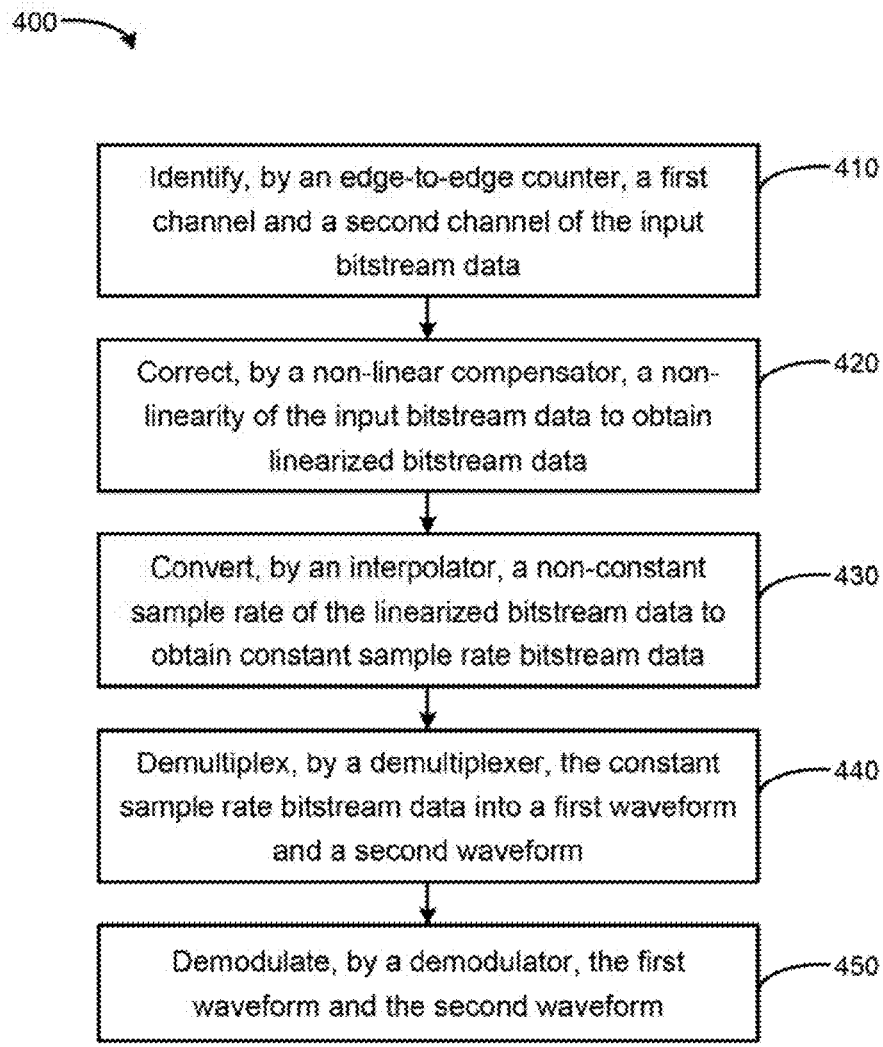
FIG. 4 is a flow chart based on obtaining a first waveform and a second waveform according to an example.

FIG. 4 is a flow chart 400 based on obtaining a first waveform and a second waveform according to an example. In block 410, an edge-to-edge counter is to identify a first channel and a second channel of the input bitstream data. For example, the edge-to-edge counter may count between positive edge to positive edge, or between negative and negative edge (depending on logic conventions used). In block 420, a non-linear compensator is to correct a non-linearity of the input bitstream data to obtain linearized bitstream data. For example, the non-linear compensator may subtract a compensation value from sample data, to correct for a discharge time corresponding to a timing capacitor of a 555 timer. In block 430, an interpolator is to convert a non-constant sample rate of the linearized bitstream data to obtain constant sample rate bitstream data. For example, four frequency samples and their corresponding time values can be used to compute the coefficients of a third-order equation according to a third-order fit to four points. Then the coefficients can be used hi cubic spline interpolation to create constant sample rate frequency values in the time interval between the second and third of the four frequency samples. In block 440, a demultiplexer is to demultiplex the constant sample rate bitstream data into a first waveform and a second waveform. For example, a demultiplexer can direct first and second channels of data from the interpolator, to outputs in the form of the first waveform and the second waveform, based on which channel corresponds to which waveform. In block 450, a demodulator is to demodulate the first waveform and the second waveform. For example, the demodulator can identify mean frequency values for the first/second channels/waveforms, and subtract those values from the first/second channels/Waveforms do demodulate the waveforms. The identified mean frequency values also may be used by the interpolator to identify which output channel the demultiplexer is to direct the data.

Figure 5:
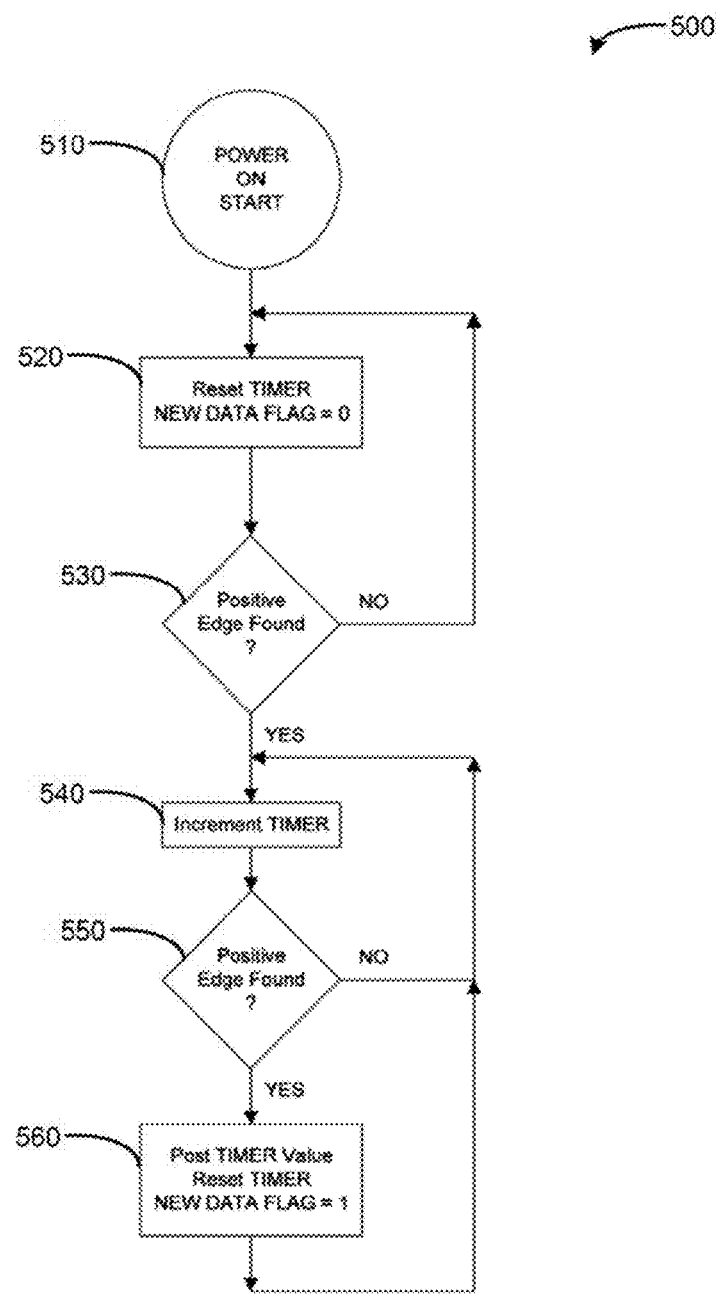
FIG. 5 is a flow chart based on obtaining time intervals between edges of input bitstream data according to an example.

FIG. 5 is a flow chart 500 based on obtaining time intervals between edges of input bitstream data according to an example. For example, this information can be used to identify which portions of interleaved input bitstream data correspond to a first channel/waveform, and which portions correspond to a second channel/waveform. These example techniques may be extended to apply to more than two waveforms accordingly, based on how much data is interleaved edge-to-edge in the input bitstream data. The timer and other values may be implemented by a mechanical encoder block in an application-specific integrated, circuit (ASIC), a digital counter, or other suitable counter (including hardware, software, and/or firmware approaches), to measure the time intervals between edges of the input bitstream data, Although edges in FIG. 5 are referred to as positive edges, examples may be based on identifying positive-to-positive edges or negative-to-negative edges (depending on logic conventions used in a given example).

The flow chart 500 begins at block 510, power on start. In block 520, the counter initializes its count to zero and also clears a communication flag that indicates a new time interval is available for processing by other tasks. In block 530, while the timer count is zero, a check is performed for detection of the first positive-going edge in the bitstream (and in alternate examples, the checks can be performed for negative-going edges, depending on logic conventions used). If an edge is not found, flow loops back to block 520. Upon finding an edge, flow proceeds from block 530 to block 540, and the counter proceeds to increment its count. At block 550, the system checks whether it has detected the next edge. If not, flow loops back to block 540. Upon finding the next edge, flow proceeds from block 550 to block 560. At block 560, the timer value is posted as the new time interval, the timer's count is cleared, the NEW DATA FLAG is set (to one), and flow loops back to block 540 to increment the count of the timer. The looping of blocks 540-560 is then repeated to accumulate timer count information for the input bitstream data.

Figure 6:
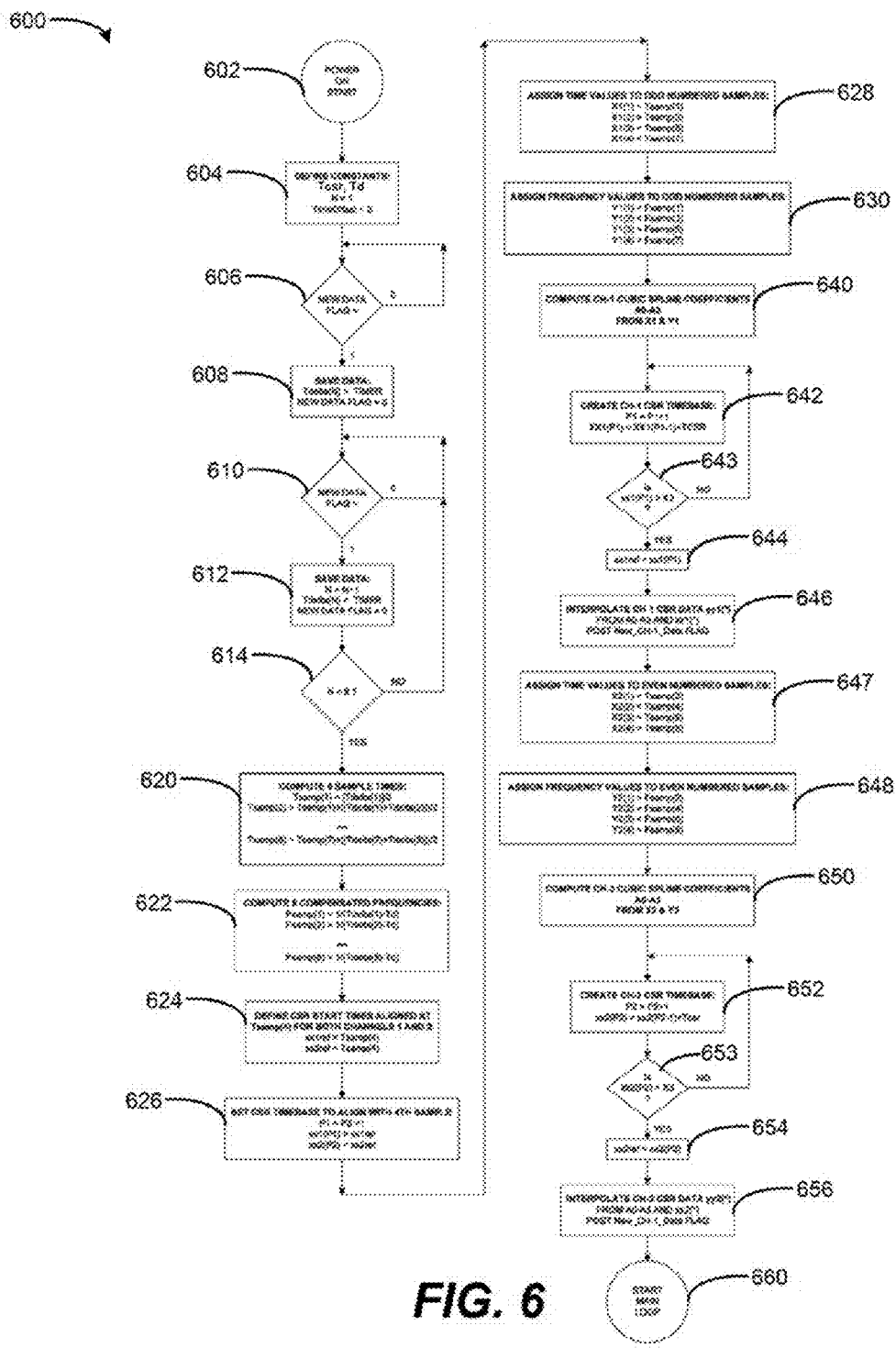
FIG. 6 is a flow chart based on interpolating constant sample rate (CSR) data according to an example.

FIG. 6 is a flow chart 600 based on interpolating constant sample rate (CSR) data according to an example. The flow chart 600 begins at block 602, to initialize a digital signal process to interpolate the data. In block 604, constants are defined including a constant sample rate time interval (Tcsr), discharge time (Td), the variable N is set to 1, and TimeOffset is set to 0. In block 606, the process waits for new time interval data to be posted, based on, whether the new data flag is updated from 0 to 1 (e.g., according to block 560 of FIG. 5). If no new data, flow repeatedly loops back to block 606. Upon detection of new data, flow proceeds to block 608, in which the process saves the first time interval value and clears the new data flag (by setting it to 0). At this point, data has been saved for the value N=1, i.e., for Tdelta(1). In block 610, the process again checks whether new data has been received by looping itself until the new data flag is set to 1 (corresponding to receiving the next value after Tdelta(1)). Flow then proceeds to block 612, in which the process increments N, saves the second time interval value, and clears the new data flag (by setting it to 0). At this point, data also has been saved for the value N=2, i.e., for Tdelta(2). In block 614, the process checks whether N has been incremented to 8, and if not, flow loops back to block 610. In other words, this process continues until the first eight time interval values are saved. Once the first eight time interval samples have been acquired, flow proceeds from block 614 to block 620. In blocks 620 and 622, the process computes the effective sample times and frequencies, compensated for the Td time. In blocks 624 and 626, the process defines the reference times for the constant sample rate (CSR) data to be at Tsamp(4), and sets the CSR timebase pointers (xx1ref and xx2ref) to the initial reference times. In blocks 628-640, the process computes CH-1 cubic spline coefficients (block 640) from the first four odd numbered time sample pairs (block 628) and the first four odd numbered frequency sample pairs (block 630), In block 642, the process then creates a constant sample rate (CSR) timebase, and uses the cubic spline coefficients to interpolate frequency values in blocks 643-646. In blocks 647-656, the process then repeats, except for using the first four even numbered time pairs (block 647) and first four even numbered frequency pairs (block 648) to produce interpolated frequency data for CH-2 (block 656), This completes the initialization process set forth in FIG. 6, and flow can proceed to block 660, to start a main loop of the process set forth in further detail below with reference to FIG. 7.

Figure 7:
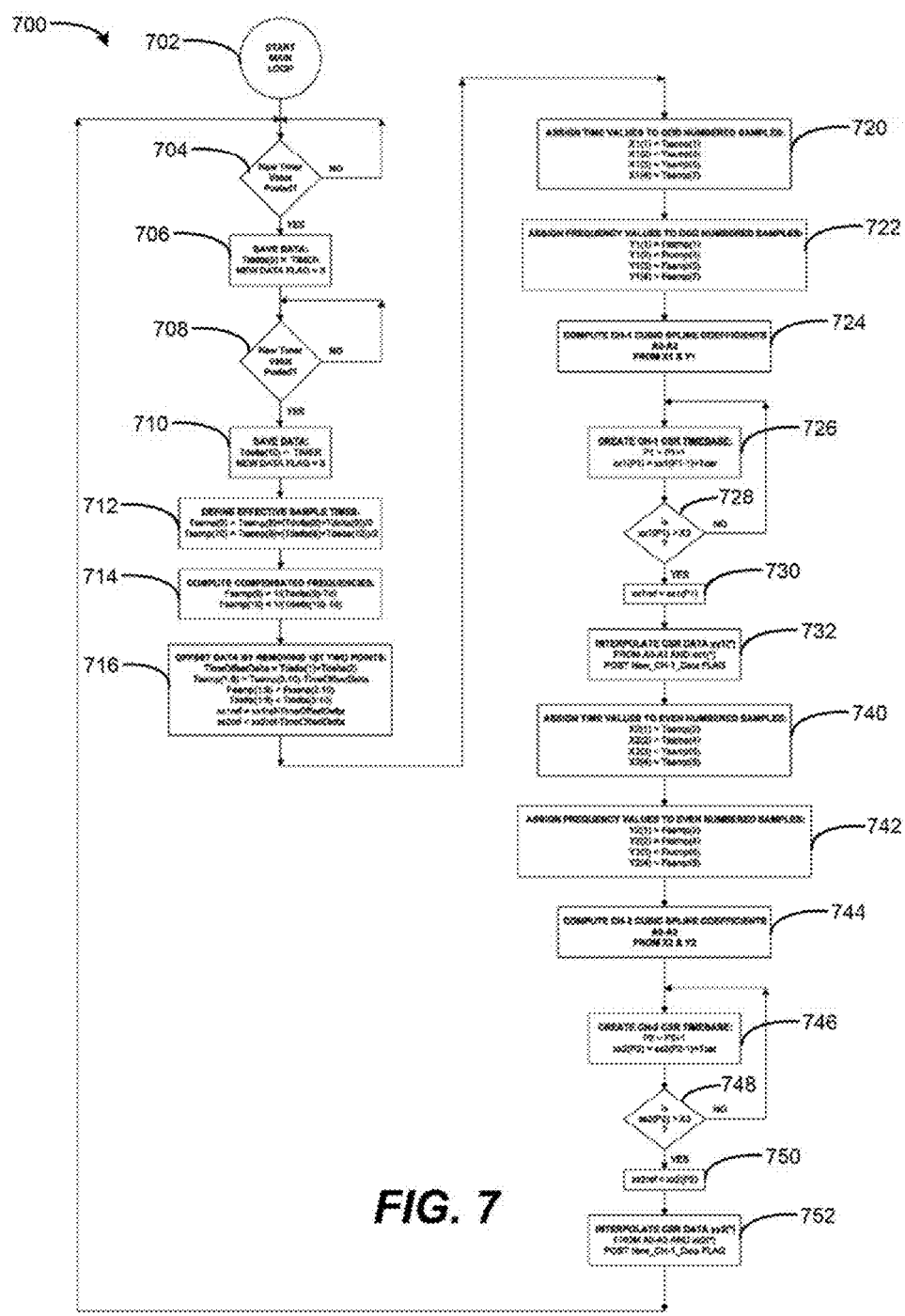
FIG. 7 is a flow chart based on interpolating constant sample rate data (CSR) according to an example.

FIG. 7 is a flow chart 700 based on interpolating constant sample rate data (CSR) according to an example. The flow chart 700 illustrates an example main computation loop, and begins at block 702. In blocks 704-710, the process waits for the next two time intervals to be posted. If a new timer value is posted at block 704, then block 706 saves the data as Tdelta(9), Here, N is given a value of 9, representing the next value following N=8 from block 614 of FIG. 6. Flow proceeds to block 708, and if a new timer value is posted at block 708, then block 710 saves the data as Tdelta(10). Here, N is given a value of 10, representing the next value following N=9 of block 706. The process now has a total of 10 samples, counting Tdelta(1) through Tdelta(8) of FIG. 6, and Tdelta(9) and Tdelta(10) of FIG. 7. In the following blocks 712 and 714, the process computes the effective sample times (Tsamp(N)) and compensated frequencies (Fsamp(N)) for the two new time interval samples corresponding to N=9 and N=10, in block 716, the process eliminates the need to keep track of a continuous timebase, by offsetting the samples by the sum of the first two time intervals. Block 716 also remaps the most recent eight samples (samples 3-10, referenced as 3:10 in block 716) into the first eight samples (samples 1:8), The process then proceeds, in blocks 720-752, to operate on these first eight samples similar to how the initialization process, as set forth above with reference to blocks 628-656 of FIG. 6, produced the CH-1 and CH-2 interpolated frequency data appended to previous data. Upon completion of block 752, the process of FIG. 7 loops back to block 704 to repeat the main loop process.

Taken together, the processes of flowcharts 500, 600, and 700 in FIGS. 5-7 enable the acquisition of non-constant rate samples and the interpolation of constant rate samples using cubic spline interpolation. Once a significant number of interpolated samples have been posted, e.g., to form demodulated first and second waveforms, other techniques may be used to operate on the output waveforms to identify any issues in the input bitstream data e.g., as obtained from voltage/current monitors on an AC mains power supply for a printing device. Such additional techniques may be used to identify the mean frequency values of the CH-1 and CH-2 data Because the voltage and current waveforms were initially modulated on distinctly different carrier frequencies, determination of whether a channel corresponds to voltage or current may be identified directly from the mean carrier values for the channels. Moreover, the mean frequency values so calculated for CH-1 and CH-2 enable the demodulation of the data by subtracting the mean frequency values from the modulated data channels, as set forth in further detail above with reference to FIG. 2.

The flow charts described herein may be implemented in code, such as a group of scripts and functions implemented in MATLAB® to serve as the basis for code developed to run the described processes in a processor of a computing system, such as a printing device. Such processes can be operated on a single block of input data or a continuous stream of input data, i.e., the input bitstream data having a non-constant sample rate and received by example devices described above. Such data can include actual voltage, and current time interval data, interleaved into a single bitstream.

Figure 8:
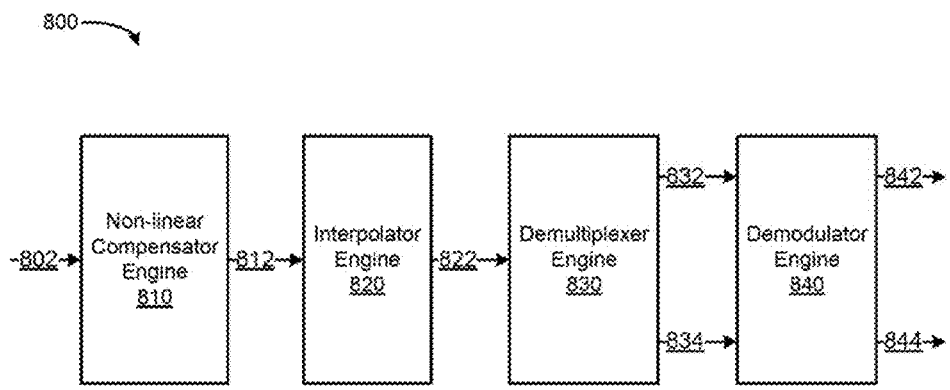
FIG. 8 is a block diagram of a system including a non-linear compensator engine, an interpolator engine, a demultiplexer engine, and a demodulator engine according to an example.

FIG. 8 is a block diagram of a system 800 including a non-linear compensator engine 810, an interpolator engine 820, a demultiplexer engine 830, and a demodulator engine 840 according to an example. The system 800 is to receive input bitstream data 802 at the non-linear compensator engine 810, which is to provide linearized bitstream data 812 to the interpolator engine 820, which is to provide constant sample rate bitstream data 822 to the demultiplexer engine 830, which is to provide first waveform 832 and second waveform 834 to the demodulator engine 840, which is to provide demodulated first waveform 842 and demodulated second waveform 844. Functionality may be performed by the engines as described above in relation to device 200 of FIG. 2, for example.

As described herein, the term "engine" may include electronic circuitry for implementing functionality consistent with disclosed examples. For example, engines 810, 820, 830, and 840 represent combinations of hardware devices (e.g., processor and/or memory) and programming to implement the functionality consistent with disclosed implementations, such as the device of FIG. 1. In examples, the programming for the engines may be processor-executable instructions stored on a non-transitory machine-readable storage media, and the hardware for the engines may include a processing resource to execute those instructions. An example system (e.g., a computing device), such as system 800, may include and/or receive the tangible non-transitory computer-readable media storing the set of computer-readable instructions. As used herein, the processor/processing resource may include one or a plurality of processors, such as in a parallel processing system, to execute the processor-executable instructions. The memory can include memory addressable by the processor for execution of computer-readable instructions. The computer-readable media can include volatile and/or non-volatile memory such as a random access memory ("RAM"), magnetic memory such as a hard disk, floppy disk, and/or tape memory, a solid state drive ("SSD"), flash memory, phase change memory, and so on.

Figure 9:
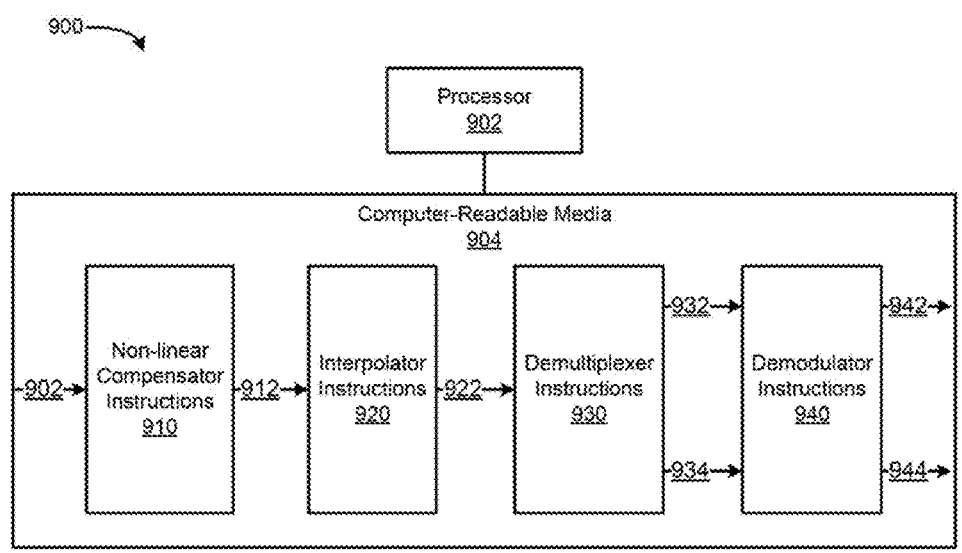
FIG. 9 is a block diagram of a system including non-linear compensator instructions, interpolator instructions, demultiplexer instructions, and demodulator instructions according to an example.

FIG. 9 is a block diagram of a system 900 including non-linear compensator instructions 910, interpolator instructions 920, demultiplexer instructions 930, and demodulator instructions 940 according to an example. The instructions 910-940 are stored on computer-readable media 904, which is associated with a processor 902 to execute instructions 910-940 to perform the functionalities described herein. The system 900 is to receive input bitstream data 902 at the non-linear compensator instructions 910, which are to provide linearized bitstream data 912 to the interpolator instructions 920, which are to provide constant sample rate bitstream data 822 to the demultiplexer instructions 930, which are to provide first waveform 932 and second waveform 934 to the demodulator instructions 940, which are to provide demodulated first waveform 942 and demodulated second waveform 944. Functionality may be performed by the engines as described above in relation to device 200 of FIG. 2, for example.

In some examples, operations performed when instructions 910-940 are executed by processor 902 may correspond to the functionality of engines 810-840 (and/or the device 100 illustrated in FIG. 1). In FIG. 9, the operations performed when instructions 910 are executed by processor 902 may correspond to functionality of non-linear compensator engine 810 (FIG. 8). Similarly, the operations performed when instructions 920-940 are executed by processor 902 may correspond, respectively to functionality of engines 820-840 (FIG. 8).

As set forth above with respect to FIG. 8, engines 810-840 may include combinations of hardware and programming. Such components may be implemented in a number of fashions. For example, the programming may be processor-executable instructions stored on tangible, non-transitory computer-readable media 904 and the hardware may include processor 902 for executing those instructions 910-940. Processor 902 may, for example, include one or multiple processors. Such multiple processors may be integrated in a single device or distributed across devices. Computer-readable media 904 may store program instructions, that when executed by processor 902, implement system 800 of FIG. 8. Media 904 may be integrated in the same device as processor 902, or it may be separate and accessible to that device and processor 902.

In some examples, program instructions can be part of an installation package that when installed can be executed by processor 902 to implement system 900. In this case, media 904 may be a portable media such as a CD, DVD, flash drive, or a memory maintained by a server from which the installation package can be downloaded and installed. In another example, the program instructions may be part of an application or applications already installed. Here, media 904 can include integrated memory such as a hard drive, solid state drive, or the like. While in FIG. 9, media 904 includes instructions 910-940, one or more instructions may be located remotely from media 904.

The computer-readable media 904 may provide volatile storage, e.g., random access memory for execution of instructions. The computer-readable media 904 also may provide non-volatile storage, e.g., hard disk or solid state disk for storage. Components of FIG. 9 may be stored in any type of computer-readable media, whether volatile or non-volatile, including firmware. Content stored on media 904 may include images, text, executable files, scripts, or other content that may be used by examples as set forth below. For example, media 904 may contain configuration information or other information that may be used by engines 810-840 an/or instructions 910-940 to provide control or other information.

What is claimed is:

1. A device to recover independent waveforms from input bitstream data, the device comprising:
 a non-linear compensator to correct a non-linearity of the input bitstream data to obtain linearized bitstream data;
 an interpolator to convert a non-constant sample rate of the linearized bitstream data to obtain constant sample rate bitstream data;
 a demultiplexer to demultiplex the constant sample rate bitstream data into a first waveform and a second waveform; and
 a demodulator to demodulate the first waveform and the second waveform.

2. The device of claim 1, further comprising a counter to identify a time interval corresponding to an edge to edge of the input bitstream data, to identify alternating portions of the input bitstream data corresponding to the first waveform and the second waveform.

3. The device of claim 2, further comprising a frequency converter to convert the time interval, obtained by the counter, to a frequency sample.

4. The device of claim 1, wherein the non-linear compensator is to correct the non-linearity of the input bitstream data based on subtracting a non-linear compensation value from the input bitstream data.

5. The method of claim 4, wherein the non-linear compensation value corresponds to a discharge time of a timing capacitor of a 555 timer.

6. The device of claim 1, wherein the interpolator is to accumulate four data samples, fit the four data samples to a third-order equation, and interpolate values in a time interval between the second and third of the four data samples according to cubic spline interpolation based on the third-order equation.

7. The device of claim 1, wherein the device is to identify one of the first waveform and the second waveform as corresponding to a voltage waveform monitored at a load, and the device is to identify a remaining one of the first waveform and the second waveform as corresponding to current waveform monitored at the load.

8. The device of claim 7, wherein the device is to identify the voltage waveform and the current waveform based on identifying direct current (DC) offsets of the first and second waveforms.

9. A method to recover independent waveforms from input bitstream data, comprising:
 identifying, by an edge-to-edge counter, a first channel and a second channel of the input bitstream data;
 correcting, by a non-linear compensator, a non-linearity of the input bitstream data to obtain linearized bitstream data;
 converting, by an interpolator, a non-constant sample rate of the linearized bitstream data to obtain constant sample rate bitstream data;
 demultiplexing, by a demultiplexer, the constant sample rate bitstream data into a first waveform and a second waveform; and
 demodulating, by a demodulator, the first waveform and the second waveform.

10. The method of claim 9, wherein obtaining the constant sample rate bitstream data is based on a moving third-order fit to four samples.

11. The method of claim 10, wherein the interpolation comprises cubic spline interpolation, using a set of four frequency samples to compute coefficients of a third-order equation, to create a constant sample rate frequency value corresponding to the interval between the second and third pair of frequency samples.

12. The method of claim 9, wherein the demodulating further comprises:
 determining a first mean frequency value of the first waveform, and subtracting the first mean frequency value from the first waveform; and
 determining a second mean frequency value of the second waveform, and subtracting the second mean frequency value from the second waveform.

13. The method of claim 12, further comprising identifying which of the first waveform and the second waveform corresponds to a voltage waveform and a current waveform based on the first and second mean frequencies.

14. A non-transitory machine-readable storage medium encoded with instructions executable by a computing system that, when executed to recover independent waveforms from input bitstream data, cause the computing system to:
- correct, by a non-linear compensator engine, a non-linearity of the input bitstream data to obtain linearized bitstream data;
- convert, by an interpolator engine, a non-constant sample rate of the linearized bitstream data to obtain constant sample rate bitstream data, wherein the interpolator engine is based on cubic spline interpolation;
- demultiplex, by a demultiplexer engine, the constant sample rate bitstream data into a first waveform and a second waveform; and
- demodulate, by a demodulator engine, the first waveform and the second waveform.

15. The storage, medium of claim 14, wherein the computing system is caused to recover independent waveforms from the input bitstream data representative of voltage and current waveforms from a power monitor of a resistive heater element of an inkjet printer.

\* \* \* \* \*

UNITED STATES PATENT AND TRADEMARK OFFICE
CERTIFICATE OF CORRECTION

PATENT NO. : 9,917,706 B1  
APPLICATION NO. : 15/558327  
DATED : March 13, 2018  
INVENTOR(S) : David E Smith Page 1 of 1

It is certified that error appears in the above-identified patent and that said Letters Patent is hereby corrected as shown below:

In the Claims

In Column 13, Line 17, in Claim 15, delete "storage," and insert -- storage --, therefor.

Signed and Sealed this  
Seventeenth Day of December, 2019

Andrei Iancu  
*Director of the United States Patent and Trademark Office*